US006825542B2

(12) United States Patent
Lam et al.

(10) Patent No.: US 6,825,542 B2
(45) Date of Patent: Nov. 30, 2004

(54) HIGH SPEED WAVEGUIDE PHOTODETECTOR

(75) Inventors: Yee Loy Lam, Singapore (SG); Yuen Chuen Chan, Singapore (SG); Chai Leng Terence Wee, Singapore (SG)

(73) Assignee: Denselight Semiconductors Pte Ltd, Singapore (SG)

( * ) Notice: Subject to any disclaimer, the term of this patent is extended or adjusted under 35 U.S.C. 154(b) by 0 days.

(21) Appl. No.: 10/350,702

(22) Filed: Jan. 24, 2003

(65) Prior Publication Data

US 2003/0173576 A1 Sep. 18, 2003

(30) Foreign Application Priority Data

Jan. 25, 2002 (GB) .............................................. 0201786

(51) Int. Cl.[7] ........................ H01L 29/06; H01L 27/00; G02B 6/26
(52) U.S. Cl. ........................... 257/466; 257/21; 257/22; 250/208.2; 250/214.1; 250/227.1; 385/129; 385/130; 385/131; 385/132
(58) Field of Search .............................. 257/21–22, 466; 250/208.2, 214, 227.11; 385/129–132

(56) References Cited

U.S. PATENT DOCUMENTS 5,391,869 A 2/1995 Ade et al.

6,239,422 B1 5/2001 Vang et al.

FOREIGN PATENT DOCUMENTS

| GB | 2 253 480 A | 9/1992 |
| JP | 9 82762 | 4/1997 |

OTHER PUBLICATIONS

Search Report under Section 17(5); Aug. 28, 2002; Application No. GB 0201786.1.

*Primary Examiner*—Donghee Kang
(74) *Attorney, Agent, or Firm*—Beyer Weaver & Thomas LLP

(57) ABSTRACT

The present invention relates to a semiconductor photodetector. The photodetector is a waveguide photodetector, which comprises: a waveguide (1,2,3) having a III-V ridge structure including an active layer (1); a semiconductor layer (4) deposited on top of the ridge structure; and, metal detector electrodes (not shown) on the surface of the higher refractive index semiconductor layer (4). The semiconductor layer (4) has a higher refractive index than the waveguide structure (1,2,3). The ridge structure is configured to widen along the length of the waveguide (1,2,3) such that light passing through the active layer (1) of the waveguide couples more efficiently up into the higher refractive index semiconductor layer (4).

6 Claims, 4 Drawing Sheets

HIGH SPEED WAVEGUIDE PHOTODETECTOR

FIELD OF THE INVENTION

Semiconductor photodetectors play an important role in the development of optical communication. They function as converters, switching light signals into electrical signals, and allowing data to be transmitted across the optical platform to the electrical platform. Semiconductor photodetectors can also be used as monitoring tools, enabling one to observe the power level of a particular signal, providing feedback to the system for power stabilization and control.

BACKGROUND OF THE INVENTION

There are many different forms of photodetectors. PIN photodetectors are one of the most commonly used types of photodetectors. This kind of photodetector has an intrinsic region sandwiched between a $p^+$ region and a $n^+$ region, in which its high resistivity causes any applied bias to drop almost entirely across the layer. Thus, all photogenerated carriers (electron-hole pairs) will be accelerated by the bias to the two opposite ends. The detection scheme could either be surface incident or waveguide incident. In either case, the detection response time is limited by the applied bias, the depletion layer width, and the fact that the electrons and holes need to travel a long distance to reach both ends of the contact.

Metal-semiconductor-metal (MSM) detectors are another form of photodetector. They are made by forming two Schottky contacts on an undoped semiconductor layer e.g. InGaAs. In operation, the incident light is absorbed by the active layer and generates electron-hole pairs; this would increase the current in the external circuit, which in turn would be detected by the contact pads. Due to the different rates of the electrons and holes reaching the contacts, this kind of detector produces gain, and due to the short distance from the electrons/holes to the contacts, the speed of the detector is normally faster as compared to PIN detectors. MSM detectors are generally used with a surface incident scheme with the metal contacts directly located above the active region.

In this disclosure, we propose a new high-speed waveguide photodetector scheme with an MSM configuration.

SUMMARY OF THE INVENTION

According to the present invention, a waveguide photodetector comprises:
- a waveguide having a III-V ridge structure including an active layer;
- a semiconductor layer deposited on top of the ridge, the semiconductor layer having a higher refractive index than the waveguide structure; and,
- metal detector electrodes on the surface of the higher refractive index semiconductor layer.
- wherein the ridge increases in width along at least a portion of the length of the waveguide such that light passing through the active layer of the waveguide couples up into the higher refractive index semiconductor layer.

The present inventors have found that, by placing a higher refractive index semiconductor layer on top of the ridge of a ridge structure waveguide, as the width of the ridge is increased, light preferentially couples up into the higher refractive index layer from the active layer of the waveguide structure. Therefore, by placing electrodes complying with the MSM detection scheme on top of the higher refractive index layer, light from the waveguide can be detected.

Preferably, the waveguide is an InP/InGaAsP waveguide. Preferably, the higher refractive index layer is undoped or lightly doped InGaAs.

In a preferred embodiment, the ridge increases in width continuously at the portion where the width increases.

The continuous width increase is an increase in width which is smooth (i.e. has no discontinuity). The increased width region has an enhanced optical coupling efficiency.

The detector electrodes may include a plurality of interdigitated metal fingers.

Advantageously, the waveguide photodetector of the present invention can be disposed within a photodetector branch of an optical tap.

According to a further aspect of the present invention, there is provided a waveguide photodetector comprising: an elongated waveguide having a III-V ridge structure including an active layer; a semiconductor layer deposited on top of the ridge, the semiconductor layer having a higher refractive index than the waveguide structure; and, metal detector electrodes on the surface of the higher refractive index semiconductor layer, wherein the ridge has a first width in a first region of the waveguide and the ridge has a second width in a second region of the waveguide, the second width being greater than the first width, and wherein the detector electrodes are provided adjacent to the second region of the waveguide such that light passing through the active layer of the waveguide couples up into the higher refractive index semiconductor layer.

The second width is preferably at least 10 µm.

In addition to a first and a second region, the ridge may further comprise an intermediate region between the first region and the second region in which the width of the ridge increases continuously along the length of the intermediate region.

BRIEF DESCRIPTION OF THE DRAWINGS

Examples of the present invention will now be described with reference to the accompanying drawings in which.

DETAILED DESCRIPTION

Figure 1:
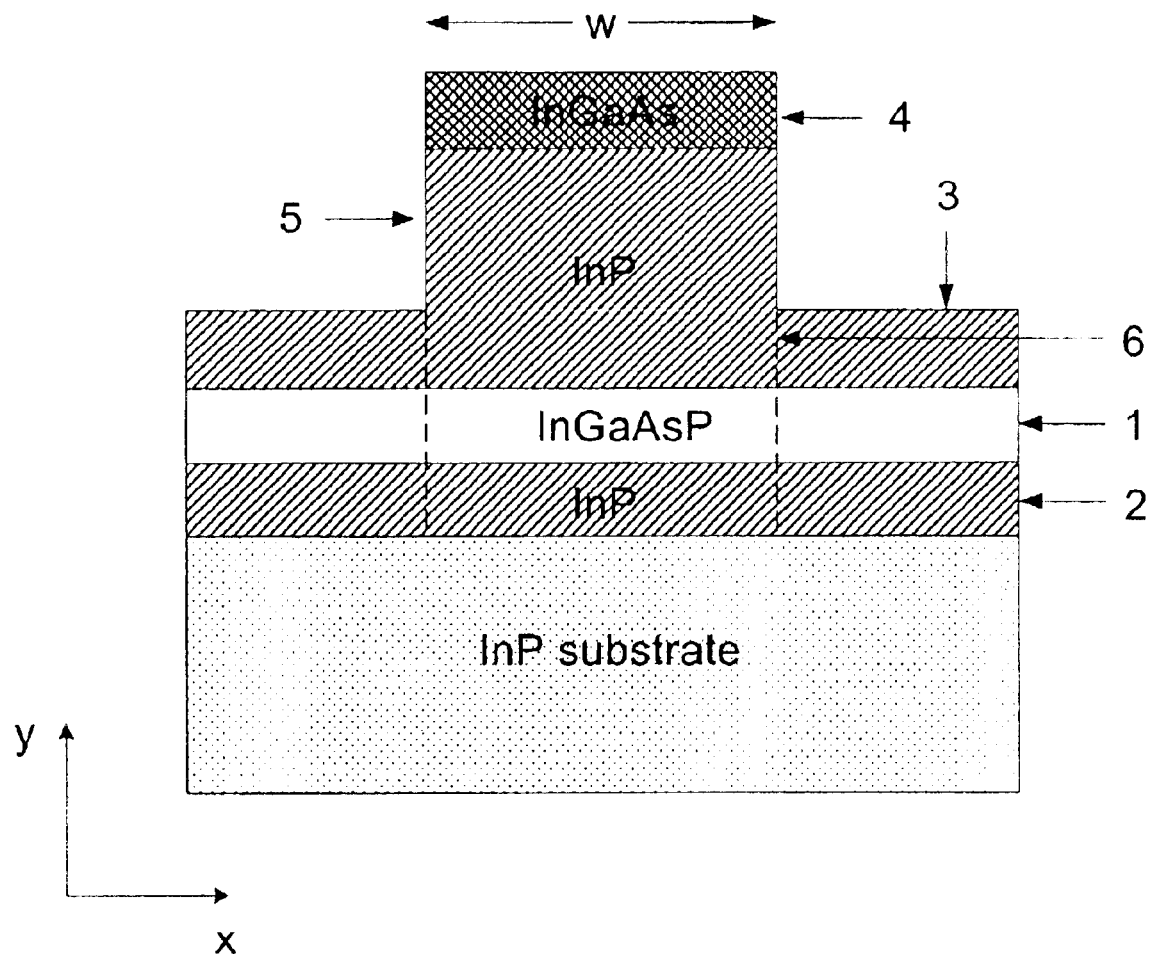
FIG. 1 shows a structure of a ridge waveguide in accordance with the present invention.

FIG. 1 shows a sample structure. The III-V ridge structure has a 0.5 µm thick InGaAsP waveguide layer (8=1.18:m) 1 with a refractive index of 3.325 which is sandwiched between a lower InP layer 2 (thickness 2 µm, RI=3.17) and an upper 3 InP layer (thickness 1.5 µm, RI=3.17). A 0.25 µm thick InGaAs layer 4 (RI=3.56) is grown above the 1.5 µm thick InP upper cladding layer 3. This layer 4 serves mainly as the detection layer. A 1.25 µm ridge 5 is etched down, stopping at 1 µm thickness of InP, leaving 0.5 µm InP un-etched. All the layers are un-doped or very lightly doped ($<10^{15}$ cm$^{-3}$). This structure is used only for illustration, and any other structure that shows similar behavior as this could be used for the proposed scheme.

Figure 2A:
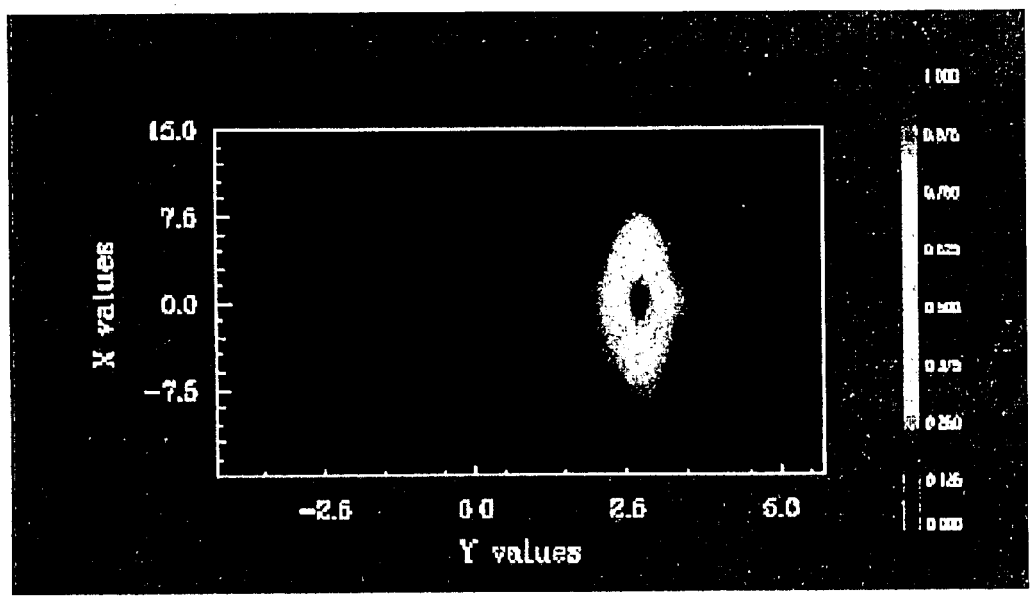
FIG. 2a shows a mode profile of a sample device structure with 2.5 µm ridge width.
Figure 2B:
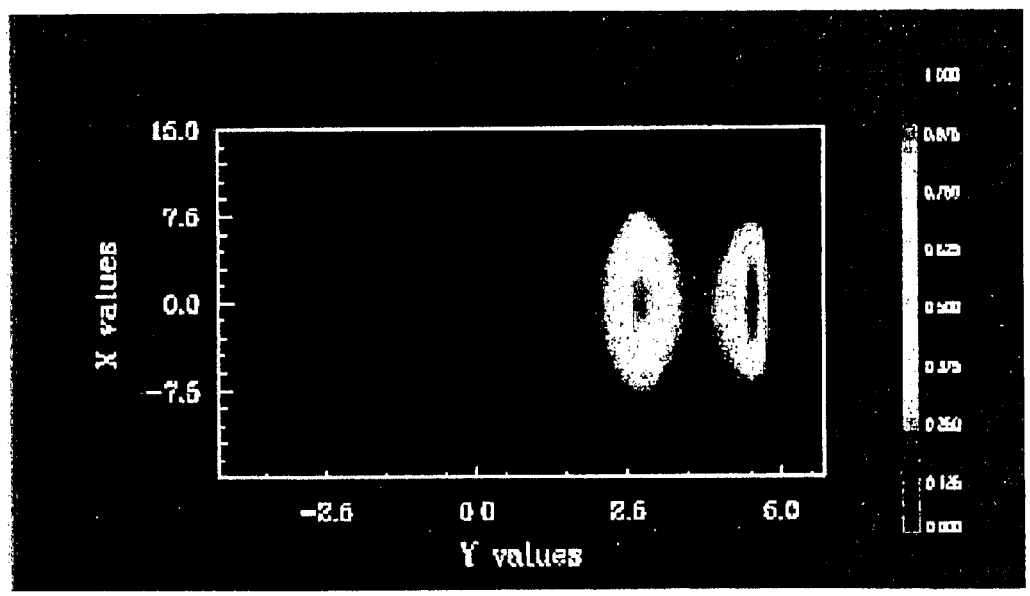
FIG. 2b shows a mode profile of a sample device structure with ridge width of 15 µm.
Figure 3:
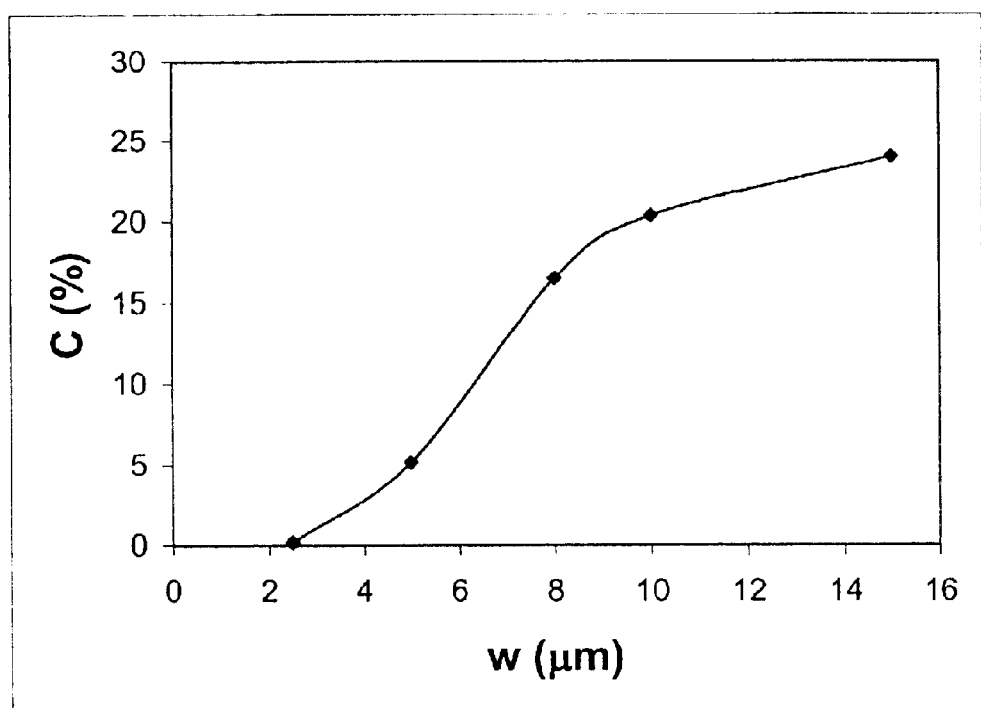
FIG. 3 shows a plot of the optical confinement factor of the top higher refractive index layer with different ridge widths; and, FIG. 4 shows a detection method utilising the waveguide photodetector of the present invention.

The proposed ridge structure can be used as a waveguide device. The InGaAsP layer 1 is able to provide strong confinement for light passing through. As seen in FIG. 2(a), the mode profile for such a structure gives a >90% confinement of the light in the active layer 1. As the width w of the ridge 5 of the waveguide increases, we can observe increasing amount of power in the mode moving towards the top InGaAs layer 4 which has a higher refractive index than the InP layers 3,2 or the InGaAsP layer 1. This is shown in FIG. 2(b), which is the mode profile of a structure with ridge width w of 15 µm. FIG. 3 shows a plot of the confinement factor C (the percentage of power that is confined in the top InGaAs layer 4) with different ridge width w. The plot clearly shows that increasing width w increases the power confined in this layer, with up to 24% power confinement at 15 µm width.

By taking advantage of such behaviour, we could easily detect a signal power by simply increasing the waveguide width w. Electrodes complying with MSM detection scheme placed on top of the InGaAs layer 4 are sufficient to provide good detection. As the light passes through a gradual mode change from a tightly confined waveguide to the upper detection layer 4, there is very minimal loss in power and almost all power could be absorbed by the detector electrodes.

As a comparative example, FIG. 1 also illustrates a rib structure in dashed lines, in which the rib 6 is etched down below the level of the InGaAsP layer 1. In a rib structure waveguide, the light is more highly confined in the InGaAsP active layer. Increasing the width of the rib does not cause light to couple up into the InGaAs layer 4 in this rib structure.

Figure 4:
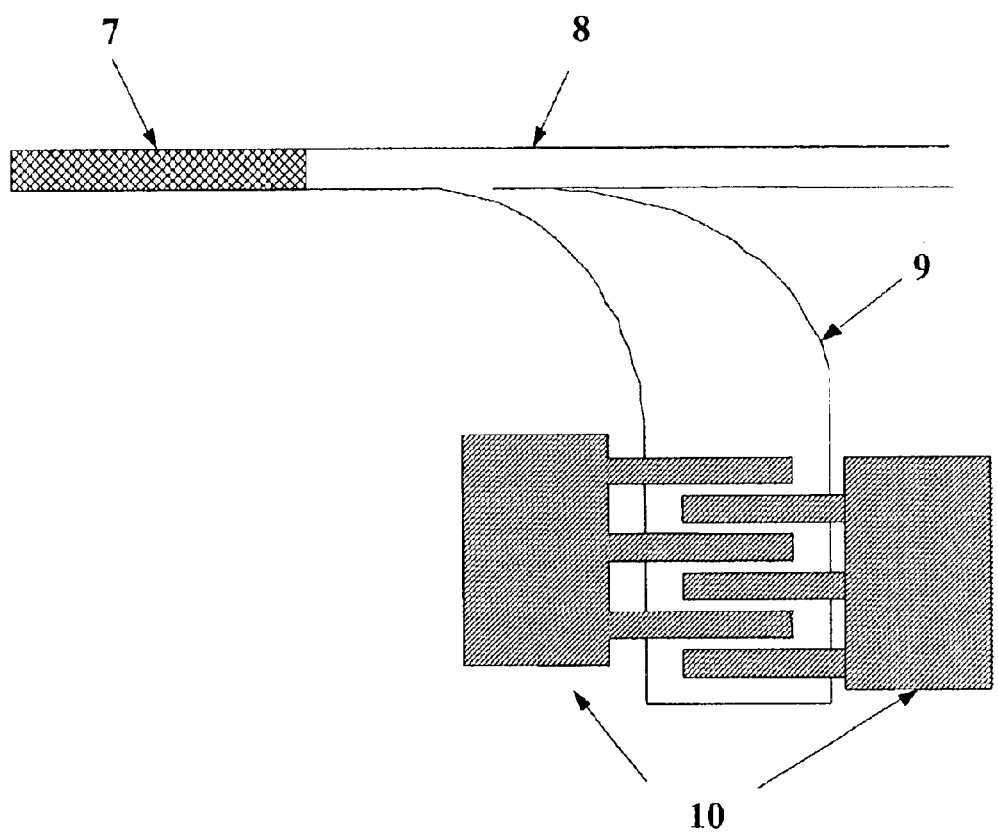

Besides using such a scheme to work purely as a detector, it is also very suitable for monitoring purposes. Due to the ease of integrating such detection scheme to a waveguide, monitoring could be easily done by simply tapping out a portion of the signal for detection. FIG. 4 shows an example of signal monitoring using this scheme. It shows a photonics integrated circuit, where a laser 7 is integrated to a waveguide 8 for transmitting signal. At the point where signal detection is desired, a tap out is done. This could be accomplished simply by Y-branches. As shown in FIG. 4, the tapped out signal passes through a distance 9 where the width is being gradually increased. When the desired width is achieved, the electrodes 10 are placed over the waveguide for signal detection.

What is claimed is:

1. A waveguide photodetector comprising:

an elongated waveguide having a III-V ridge structure including an active layer between two cladding layers, and a ridge;

a semiconductor layer providing a top layer of the ridge, the semiconductor layer having a higher refractive index than the active and two cladding layers; and, metal detector electrodes on the surface of the higher refractive index semiconductor layer, wherein the ridge increases in width along at least a portion of the length of the waveguide such that light passing through the active layer of the waveguide couples up into the higher refractive index semiconductor layer.

2. A waveguide photodetector according to claim 1, wherein the waveguide is an InP/InGaAsP waveguide.

3. A waveguide photodetector according to claim 1, wherein the higher refractive index layer is undoped or lightly doped InGaAs.

4. A waveguide photodetector according to claim 1, wherein the ridge increases in width continuously.

5. A waveguide photodetector according to claim 1, wherein the detector electrodes include a plurality of interdigitated metal fingers.

6. An optical tap having at least one photodetector branch, wherein the at least one photodetector branch has a waveguide photodetector according to claim 1 disposed therein.

* * * * *